(12) United States Patent
Hashimoto (10) Patent No.: US 11,699,689 B2
(45) Date of Patent: Jul. 11, 2023

(54) METHOD FOR MANUFACTURING PLANAR LIGHT SOURCE

(71) Applicant: NICHIA CORPORATION, Anan (JP)

(72) Inventor: Toru Hashimoto, Tokushima (JP)

(73) Assignee: NICHIA CORPORATION, Anan (JP)

( * ) Notice: Subject to any disclaimer, the term of this patent is extended or adjusted under 35 U.S.C. 154(b) by 93 days.

(21) Appl. No.: 17/161,023

(22) Filed: Jan. 28, 2021

(65) Prior Publication Data
US 2021/0242181 A1    Aug. 5, 2021

(30) Foreign Application Priority Data
Jan. 31, 2020   (JP) .................................. 2020-015712

(51) Int. Cl.
| | | |
|---|---|---|
| *H01L 25/075* | (2006.01) | |
| *H01L 33/58* | (2010.01) | |
| *H01L 33/60* | (2010.01) | |
| *H01L 33/62* | (2010.01) | |

(52) U.S. Cl.
CPC .......... *H01L 25/0753* (2013.01); *H01L 33/58* (2013.01); *H01L 33/60* (2013.01); *H01L 33/62* (2013.01); *H01L 2933/0058* (2013.01); *H01L 2933/0066* (2013.01); *H01L 2933/0091* (2013.01)

(58) Field of Classification Search
CPC ..... H01L 25/0753; H01L 33/58; H01L 33/62; H01L 33/60; H01L 2933/0058; H01L 2933/0066; H01L 2933/0091
See application file for complete search history.

(56) References Cited

U.S. PATENT DOCUMENTS

| | | | | |
|---|---|---|---|---|
| 2006/0261364 | A1* | 11/2006 | Suehiro | .................... H01L 24/17 257/E33.059 |
| 2008/0137335 | A1 | 6/2008 | Tsai et al. | |
| 2009/0194775 | A1* | 8/2009 | Chakraborty | ........... H01L 33/50 438/27 |
| 2010/0182792 | A1* | 7/2010 | Hsiao | .................... H01L 33/486 362/310 |

(Continued)

FOREIGN PATENT DOCUMENTS

| | | |
|---|---|---|
| CN | 103700758 A | 4/2014 |
| JP | 2009244405 A | 10/2009 |

(Continued)

*Primary Examiner* — Feifei Yeung Lopez
(74) *Attorney, Agent, or Firm* — Hunton Andrews Kurth LLP (57) ABSTRACT

A method for manufacturing a planar light source includes preparing a wiring substrate including a first region that includes a light source placement section; disposing a light-reflective member in the first region of the wiring substrate; preparing a light guide plate including a first major surface, a second major surface opposite to the first major surface, and a first hole extending from the first major surface to the second major surface; disposing a light source on the light-reflective member at the light source placement section; disposing the light guide plate on the wiring substrate to cause the wiring substrate and the second major surface of the light guide plate to face each other to cause the light source to be positioned in the first hole; and disposing a first light-transmitting member in the first hole.

9 Claims, 7 Drawing Sheets

(56) References Cited

U.S. PATENT DOCUMENTS

| | | | |
|---|---|---|---|
| 2013/0328094 A1* | 12/2013 | Lee | H01L 33/60 |
| | | | 257/98 |
| 2016/0190406 A1* | 6/2016 | Liu | H01L 33/505 |
| | | | 257/98 |
| 2017/0200873 A1 | 7/2017 | Nakabayashi | |
| 2017/0279019 A1* | 9/2017 | Ueda | H01L 33/56 |

FOREIGN PATENT DOCUMENTS

| | | |
|---|---|---|
| JP | 2017123393 A | 7/2017 |
| KR | 20090117419 A | 11/2009 |

* cited by examiner

METHOD FOR MANUFACTURING PLANAR LIGHT SOURCE

CROSS-REFERENCE TO RELATED APPLICATION

This application claims priority to Japanese Patent Application No. 2020-015712, filed on Jan. 31, 2020, the disclosure of which is hereby incorporated by reference in its entirety.

BACKGROUND

The present disclosure relates to a method for manufacturing a planar light source.

Light-emitting modules that combine a light guide plate and a light-emitting element such as a light-emitting diode or the like are widely utilized in planar light sources such as, for example, backlights of liquid crystal displays, etc. For example, Korean Patent No. 10-2009-0117419 discusses a structure that includes a light guide plate, and a light source located in a through-hole formed in the light guide plate.

SUMMARY

The present disclosure provides a method for manufacturing a planar light source that can suppress the formation of a light-reflective member on an inner side surface of a first hole of a light guide plate and on a side surface of a light source located in the first hole.

In an embodiment of the present disclosure, a method for manufacturing a planar light source includes preparing a wiring substrate including a first region that includes a light source placement section; disposing a light-reflective member in the first region of the wiring substrate; preparing a light guide plate including a first major surface, a second major surface opposite to the first major surface, and a first hole extending from the first major surface to the second major surface; disposing a light source on the light-reflective member at the light source placement section; disposing the light guide plate on the wiring substrate to cause the wiring substrate and the second major surface of the light guide plate to face each other to cause the light source to be positioned in the first hole; and disposing a first light-transmitting member in the first hole. According to the present disclosure, the formation of a light-reflective member on an inner side surface of a first hole of a light guide plate and on a side surface of a light source located in the first hole can be suppressed.

DETAILED DESCRIPTION OF EMBODIMENTS

Embodiments will now be described with reference to the drawings. The same components in the drawings are marked with the same reference numerals.

Figure 1:
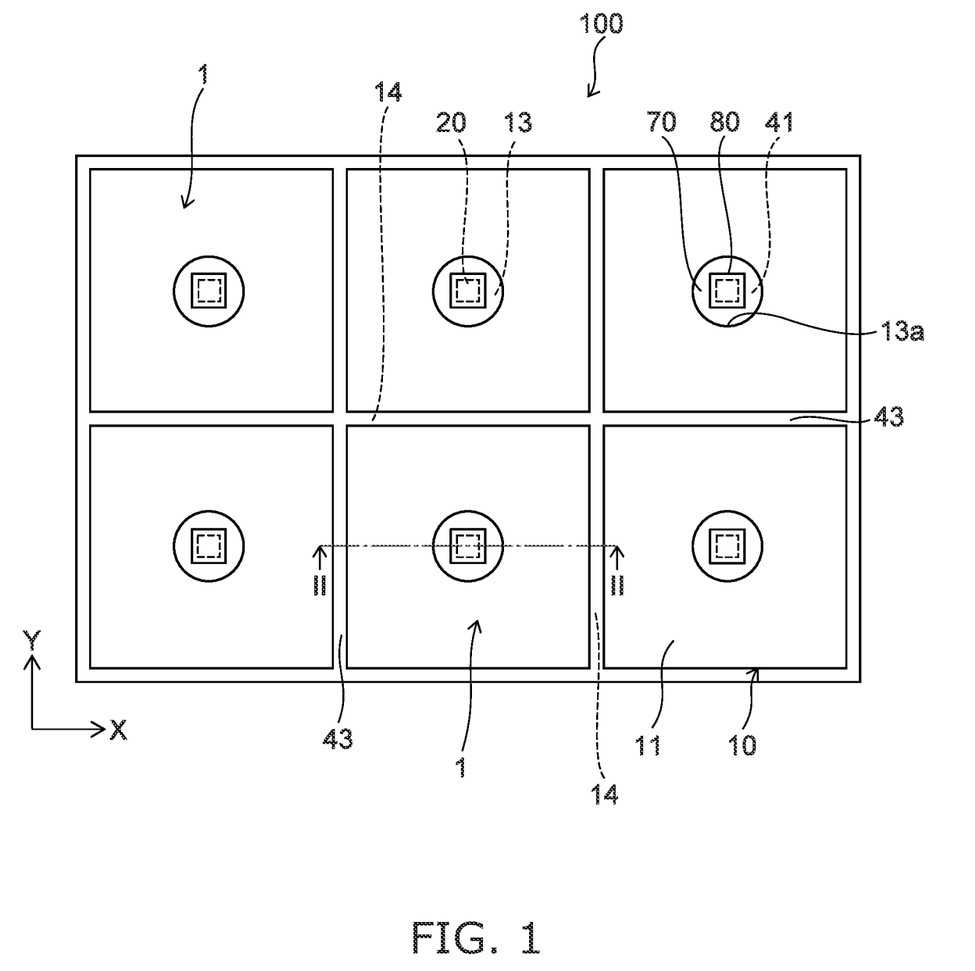
FIG. 1 is a schematic plan view of a planar light source of an embodiment of the present disclosure.

FIG. 1 is a schematic plan view of a planar light source 100 of an embodiment of the present disclosure. FIG. 1 illustrates a top view of the light-emitting surface of the planar light source 100. In FIG. 1, two mutually-orthogonal directions parallel to the light-emitting surface of the planar light source 100 are taken as an X-direction and a Y-direction.

The planar light source 100 may include one or multiple light sources 20. When the planar light source 100 includes multiple light sources 20, the light sources 20 are separated from each other by a partitioning trench 14. One divided region also is called a light-emitting region 1. When the planar light source includes one light source 20, one planar light source includes one light-emitting region 1. Thus, a planar light source device can have a larger surface area by arranging multiple planar light sources that each include one light source 20 or multiple planar light sources 100 that each include multiple light sources 20.

The planar light source 100 shown in FIG. 1 has a rectangular exterior form having two sides extending along the X-direction and two sides extending along the Y-direction.

For example, one light-emitting region 1 may be used as a driving unit of local dimming. FIG. 1 illustrates the planar light source 100 that includes six light-emitting regions 1 divided into two rows and three columns. The number of the light-emitting regions 1 included in the planar light source 100 is not limited to the number shown in FIG. 1.

Figure 2:
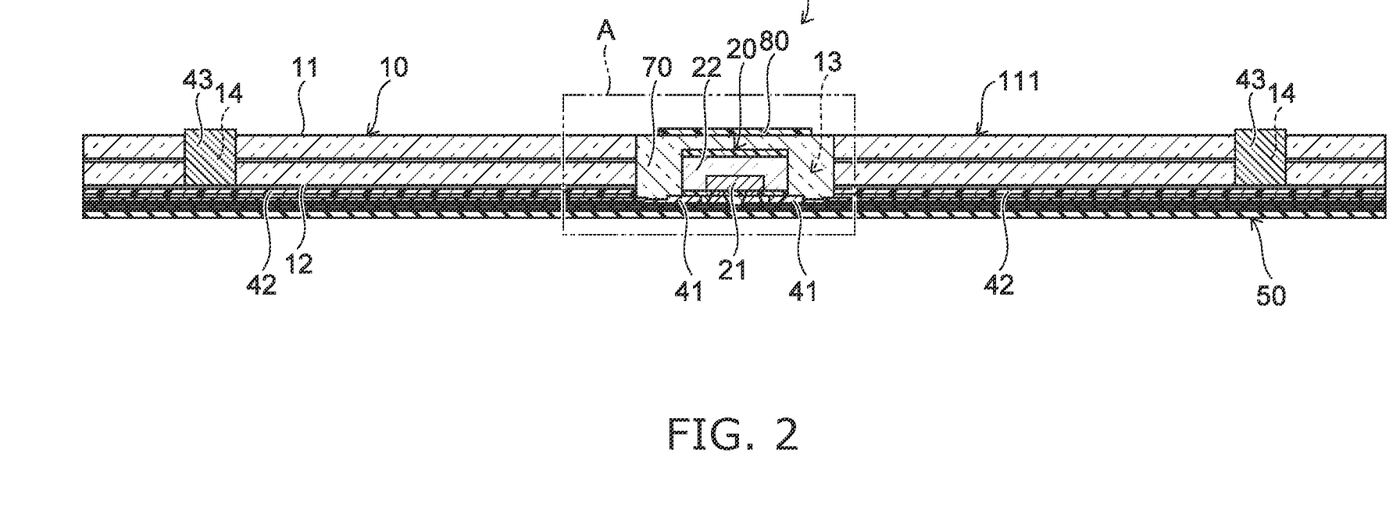
FIG. 2 is a schematic cross-sectional view along line II-II of FIG. 1.
Figure 3:
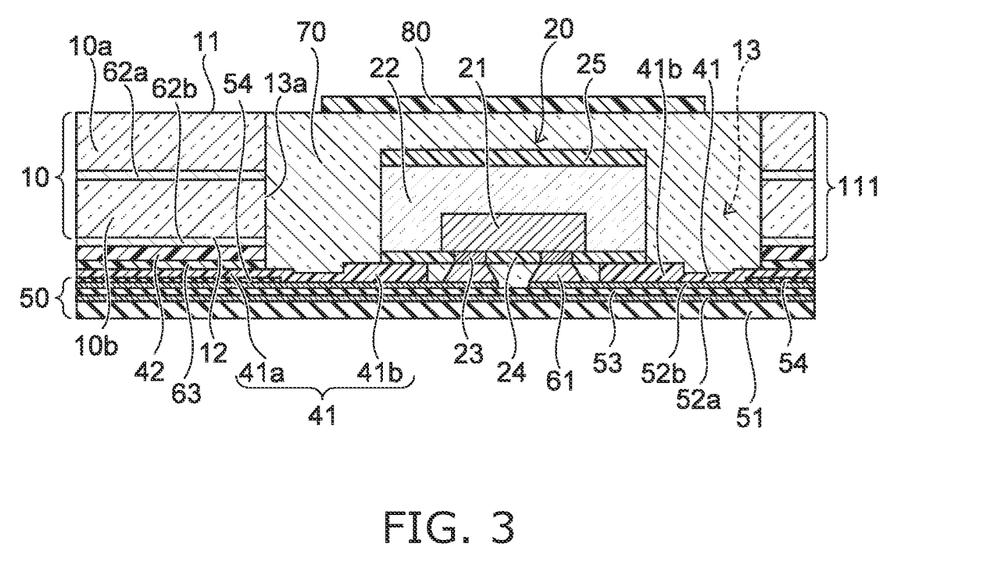
FIG. 3 is an enlarged cross-sectional view of portion A of FIG. 2.

FIG. 2 is a schematic cross-sectional view along line II-II of FIG. 1, and is a schematic cross section of a portion including the light-emitting region 1 including one light source 20. FIG. 3 is an enlarged cross-sectional view of portion A of FIG. 2.

The planar light source 100 includes a wiring substrate 50, a stacked structure body 111, the light source 20, a light-reflective member 41, a light-reflecting sheet 42, and a first light-transmitting member 70.

Figure 6:
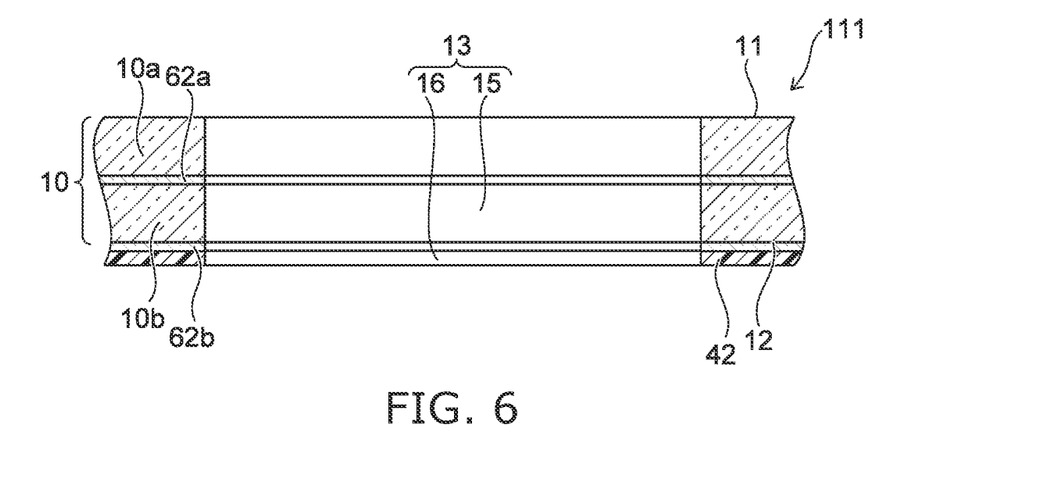

The stacked structure body 111 includes a light guide plate 10 and the light-reflecting sheet 42. As shown in FIG. 6, which is described below, the light guide plate 10 includes a first hole 15. The light-reflecting sheet 42 includes a second hole 16 that overlaps the first hole 15. In other words, the stacked structure body 111 includes a through-hole 13 that includes the first hole 15 and the second hole 16.

The inner side surfaces of the first and second holes 15 and 16 may be perpendicular surfaces or oblique surfaces with respect to a first major surface 11 or a second major surface 12 of the light guide plate 10. Also, the inner side surfaces of the first and second holes 15 and 16 may have shapes that combine perpendicular surfaces and/or oblique surfaces with respect to the first or second major surface 11 or 12 of the light guide plate 10.

The first hole 15 and the second hole 16 may be circular or elliptical when viewed in plan. The first hole 15 and the second hole 16 may be polygonal such as triangular, rectangular, hexagonal, octagonal, etc., when viewed in plan. It is favorable for the centers of the first and second holes 15 and 16 to match each other when viewed in plan.

The light guide plate 10 is transmissive to light emitted by the light source 20. The light source 20 includes a light-emitting element 21. The light that is emitted by the light source 20 refers to the light emitted by the light-emitting element 21. When the light source 20 includes a fluorescer, the light that is emitted by the light source 20 also includes the light emitted by the fluorescer. For example, it is favorable for the transmittance of the light guide plate 10 to the light from the light source 20 to be 80% or more, and more favorably 90% or more.

For example, the light guide plate 10 has a two-layer configuration in which light-transmitting members 10a and 10b are stacked with a light-transmitting bonding layer 62a interposed. The light guide plate 10 may include a single layer or may include three or more stacked layers of light-transmitting members.

For example, a thermoplastic resin such as acrylic, polycarbonate, cyclic polyolefin, polyethylene terephthalate, polyester, or the like, a thermosetting resin such as epoxy, silicone, or the like, glass, etc., may be used as the materials of the light-transmitting members 10a and 10b.

The light guide plate 10 includes the first major surface 11 that is used as the light-emitting surface of the planar light source 100, and the second major surface 12 at the side opposite to the first major surface 11. As described above with reference to FIG. 6, the light guide plate 10 includes the first hole 15 that extends from the first major surface 11 to the second major surface 12. It is favorable for the thickness of the light guide plate 10 to be not less than 200 μm and not more than 800 μm.

One planar light source 100 may include multiple light sources 20. That is, one light guide plate 10 may include multiple first holes 15. In such a case as shown in FIG. 1, it is favorable for the light guide plate 10 to include the partitioning trench 14 in a lattice configuration that includes the partitioning trench 14 extending in a straight-line shape in the X-direction and the partitioning trench 14 extending in the Y-direction. The partitioning trench 14 divides the light-emitting regions 1. In other words, the region that is surrounded with the partitioning trench 14 is one light-emitting region 1.

The shape of the partitioning trench 14 when viewed in plan may be determined according to the shape of the light-emitting region 1. For example, when the adjacent light-emitting regions 1 are rectangular, the partitioning trench 14 that is located between the adjacent light-emitting regions 1 has a straight-line shape with a constant width when viewed in plan. The width of the partitioning trench 14 may be, for example, not more than about 5% of the width of the light-emitting region 1. When the light-reflective member is located inside the partitioning trench 14, it is favorable for the partitioning trench 14 to have an opening width such that the light-reflective member can be disposed inside the partitioning trench 14. For example, when a resin material that includes a light-diffusing agent is used as the light-reflective member, the opening width of the partitioning trench 14 may be appropriately selected according to the viscosity of the resin material, etc. In particular, the viscosity of the light-reflective member easily increases when the content of the light-diffusing agent is increased to increase the reflectance of the light-reflective member. Therefore, if the opening width is too narrow, it is difficult to dispose the light-reflective member at the appropriate position of the inner side surface inside the partitioning trench 14. In such a case, it is favorable for the opening width of the partitioning trench 14 to be appropriately wide.

As shown in FIG. 2, a light-reflective member 43 may be provided inside the partitioning trench 14. The light-reflective member 43 may be reflective to the light emitted by the light source 20. For example, a resin material that includes a fine particle of $TiO_2$, $SiO_2$, $Al_2O_3$, ZnO, or the like is an example of the light-reflective member 43. Or, the light-reflective member 43 may include a light-reflective metal member of Al, Ag, etc. A member that has a lower refractive index than the refraction of the light guide plate 10 may be provided inside the partitioning trench 14. Air and the like are examples of the low-refractive-index member.

The light-reflective member 43 that is located inside the partitioning trench 14 may be formed to fill the entire space inside the partitioning trench 14.

The light-reflective member 43 may include a portion that extends onto the first major surface 11 of the light guide plate 10 from the interior of the partitioning trench 14.

When the light-reflective member 43 is provided inside the partitioning trench 14, for example, the light-reflective member 43 may be provided along the shape of the inner side surface of the partitioning trench 14 as shown in FIG. 2. A portion of the upper surface of the light-reflective member 43 may be positioned lower than the first major surface 11 of the light guide plate 10. The cross section of the partitioning trench 14 may be V-shaped, and the cross section of the light-reflective member 43 also may be V-shaped. It is favorable for the light-reflective member 43 to cover the entire inner side surface of the partitioning trench 14.

FIG. 2 illustrates the partitioning trench 14 that extends through the light guide plate 10. The partitioning trench 14 may be a bottomed partitioning trench 14 that has an opening at the first major surface 11 side and a bottom that does not reach the second major surface 12. When the partitioning trench 14 is bottomed, the bottom may be at any position in the thickness direction of the light guide plate 10. For example, when it is desirable to suppress light leakage to the adjacent light-emitting regions 1, it is favorable for the bottom to be positioned at not less than 50% of the thickness of the light guide plate 10, more favorably 70%, and particularly favorably 90% or more. That is, it is favorable for the bottom of the partitioning trench 14 to be proximate to the second major surface 12.

The partitioning trench 14 may be a bottomed trench that has an opening at the second major surface 12 side and a bottom that does not reach the first major surface 11.

The partitioning trench 14 may be separated from the first and second major surfaces 11 and 12. For example, the light guide plate 10 may have a two-light-guide-plate stacked structure in which the light-transmitting member 10a including a surface used as the first major surface 11 and the light-transmitting member 10b including a surface used as the second major surface 12 are stacked. The lower surface of the light-transmitting member 10a includes a bottomed first trench, and the upper surface of the light-transmitting member 10b includes a bottomed second trench. Then, by providing the first trench and the second trench to overlap when viewed in plan, the light guide plate 10 can include a partitioning trench including the first and second trenches at a position separated from the first and second major surfaces 11 and 12.

The partitioning trench 14 may extend from the first major surface 11 to the second major surface 12. Also, the partitioning trench 14 that extends through the light guide plate 10 may communicate with a trench located in the light-reflecting sheet 42, which is included with the light guide plate 10 in the stacked structure body 111. That is, the partitioning trench can include a through-trench that extends through the light guide plate 10, and a bottomed through-trench that is located in the light-reflecting sheet 42.

The light source 20 is located on the wiring substrate 50 inside the through-hole 13 of the stacked structure body 111. The light-reflecting sheet 42 is bonded to the second major surface 12 of the light guide plate 10 via a light-transmitting bonding layer 62b.

The light-reflecting sheet 42 is reflective to the light emitted by the light source 20. The light-reflecting sheet 42 may include, for example, a sheet-like resin material. The light-reflecting sheet 42 may include a white resin material including a light-diffusing agent or a white resin including many bubbles as the light-diffusing agent. For example, a fine particle of $TiO_2$, $SiO_2$, $Al_2O_3$, $ZnO$, or the like is an example of the light-diffusing agent. For example, a thermoplastic resin such as acrylic, polycarbonate, cyclic polyolefin, polyethylene terephthalate, polyester, or the like, a thermosetting resin such as epoxy, silicone, or the like, glass, etc., may be used as the resin material included in the light-reflecting sheet 42.

The stacked structure body 111 is located on the wiring substrate 50. The second major surface 12 of the light guide plate 10 faces the wiring substrate 50, and the light-reflecting sheet 42 is located between the wiring substrate 50 and the second major surface 12 of the light guide plate 10.

The light-reflecting sheet 42 is bonded to the wiring substrate 50 via a bonding layer 63. In other words, the light guide plate 10 is located on the wiring substrate 50 with the bonding layer 63, the light-reflecting sheet 42, and the bonding layer 62b interposed. The bonding layers 63 and 62b are, for example, resin layers of an epoxy resin, an acrylic resin, an olefin resin, etc.

Figure 4A:
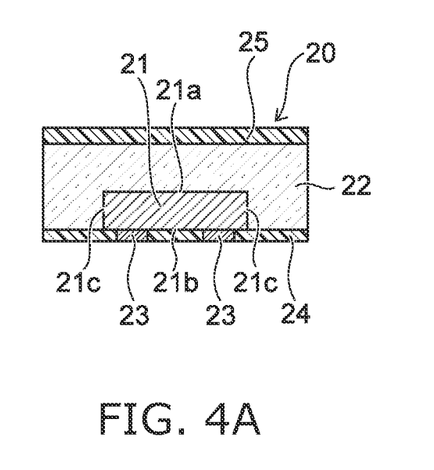
FIG. 4A is a schematic cross-sectional view of a light source of the embodiment of the present disclosure.

FIG. 4A is a schematic cross-sectional view of the light source 20.

The light source 20 includes the light-emitting element 21 and a second light-transmitting member 22. The light source 20 may further include at least one of a cover member 24 or a second light-modulating member 25.

The light-emitting element 21 includes a semiconductor stacked body and a pair of positive and negative electrodes 23. The light-emitting element 21 may emit ultraviolet light or visible light. The light-emitting element 21 may emit blue to red as the visible light. The semiconductor stacked body may include, for example, $In_xAl_yGa_{1-x-y}N$ ($0 \le x$, $0 \le y$, and $x+y \le 1$).

The semiconductor stacked body of the light-emitting element 21 includes an element upper surface 21a, an element lower surface 21b, and an element side surface 21c between the element upper surface 21a and the element lower surface 21b. The pair of positive and negative electrodes 23 is located at the element lower surface 21b. The pair of positive and negative electrodes 23 may be located at the element upper surface 21a.

The second light-transmitting member 22 covers the element upper surface 21a and the element side surface 21c of the light-emitting element 21. The second light-transmitting member 22 includes a light-transmitting resin, and a fluorescer dispersed in the light-transmitting resin. The light-transmitting resin is, for example, a silicone resin and an epoxy resin. The fluorescer is excited by the light emitted by the light-emitting element 21 and emits light of a different wavelength from the wavelength of the light emitted by the light-emitting element 21.

For example, the fluorescer may include an yttrium-aluminum-garnet-based fluorescer (e.g., $Y_3(Al, Ga)_5O_{12}$:Ce), a lutetium-aluminum-garnet-based fluorescer (e.g., $Lu_3(Al, Ga)_5O_{12}$:Ce), a terbium-aluminum-garnet-based fluorescer (e.g., $Tb_3(Al, Ga)_5O_{12}$:Ce), a β-sialon-based fluorescer (e.g., $Si_{6-z}Al_zO_zN_{8-z}$:Eu ($0<z<4.2$)), an α-sialon-based fluorescer (e.g., $Mz(Si, Al)_{12}(O, N)_{16}$ (however, $0<z \le 2$, and M is a lanthanide element other than Li, Mg, Ca, Y, La, and Ce)), a nitride fluorescer such as a nitrogen-including calcium aluminosilicate (CASN or SCASN)-based fluorescer (e.g., (Sr, Ca)AlSiN$_3$:Eu) or the like, a fluoride-based fluorescer such as a KSF-based fluorescer ($K_2SiF_6$:Mn), a MGF-based fluorescer ($3.5MgO.0.5MgF_2.GeO_2$: Mn), etc. The second light-transmitting member 22 may include multiple types of fluorescers. Also, the second light-transmitting member 22 may have a configuration in which multiple layers of different types of fluorescers are stacked.

The cover member 24 is located at the element lower surface 21b of the light-emitting element 21. The cover member 24 is provided so that at least a portion of the surfaces (in FIG. 4A, the lower surfaces) of the electrodes 23 are exposed from under the cover member 24. The cover member 24 may be provided also at the lower surface of the second light-transmitting member 22 covering the element side surface 21c of the light-emitting element 21.

The cover member 24 is reflective to the light emitted by the light source 20. The cover member 24 is, for example, a white resin member including a light-diffusing agent. For example, a fine particle of $TiO_2$, $SiO_2$, $Al_2O_3$, $ZnO$, or the like is an example of the light-diffusing agent.

The light source 20 may include the second light-modulating member 25. The second light-modulating member 25 is located at the upper surface of the second light-transmitting member 22. The second light-modulating member 25 covers the upper surface of the second light-transmitting member 22. The second light-modulating member 25 is reflective and transmissive to the light emitted by the light-emitting element 21 and the fluorescer.

The second light-modulating member 25 may include a light-transmitting resin, and a light-diffusing agent dispersed in the light-transmitting resin. The light-transmitting resin is, for example, a silicone resin or an epoxy resin. For example, a fine particle of $TiO_2$, $SiO_2$, $Al_2O_3$, $ZnO$, or the like is an example of the light-diffusing agent. The second light-modulating member 25 may be, for example, a metal member of Al, Ag, or the like, or a DBR (Distributed Bragg Reflector).

As shown in FIG. 3, the light-reflective member 41 is provided between the stacked structure body 111 and the wiring substrate 50. The light-reflective member 41 is provided also on the wiring substrate 50 at the periphery of the light source 20 inside the through-hole 13. The light-reflective member 41 is, for example, a white resin layer that includes a fine particle of $TiO_2$, $SiO_2$, $Al_2O_3$, $ZnO$, or the like as a light-diffusing agent. The light-reflective member 41 is provided also at a portion of a region between the wiring substrate 50 and the lower surface of the light source 20. The light-reflective member 41 is located on the wiring substrate 50 with a greater surface area than the surface area (the opening area) of the through-hole 13.

The light-reflective member 41 includes a portion 41a that is located between the wiring substrate 50 and the second major surface 12 of the light guide plate 10, and a thick film portion 41b that is thicker than the portion 41a. At least a portion of the thick film portion 41b is provided between the wiring substrate 50 and the lower surface of the light source 20, and a portion of the light source 20 is located on the thick film portion 41b.

The lower surface of the second light-transmitting member 22 of the light source 20 is higher than the lower surface of the light-reflecting sheet 42, which is located below the second major surface 12 of the light guide plate 10.

The first light-transmitting member 70 is provided inside the through-hole 13. The first light-transmitting member 70 is transmissive to the light emitted by the light source 20 and may include, for example, the same resin as the materials of the light-transmitting members 10a and 10b of the light guide plate 10 or a resin having a small refractive index difference with the materials of the light-transmitting members 10a and 10b. Or, glass may be used as the material of the first light-transmitting member 70.

The first light-transmitting member 70 is provided between the side surface of the light source 20 and an inner side surface 13a of the through-hole 13. The first light-transmitting member 70 may be disposed so that a space such as an air layer or the like is not formed between the first light-transmitting member 70 and the side surface of the light source 20 or between the first light-transmitting member 70 and the inner side surface 13a of the through-hole 13.

The first light-transmitting member 70 is located on the light-reflective member 41 inside the through-hole 13 and covers the light-reflective member 41. Also, the first light-transmitting member 70 is located on the light source 20 and covers the upper surface of the light source 20 (the upper surface of the second light-modulating member 25). The upper surface of the first light-transmitting member 70 may be a flat surface. Or, the upper surface of the first light-transmitting member 70 may be a concave or convex curved surface. The first light-transmitting member 70 may contact the entire surface of the inner surface of the through-hole 13. Or, the first light-transmitting member 70 may be provided so that a portion of the inner side surface of the first hole 15 is exposed. The first light-transmitting member 70 may include a portion extending onto the first major surface 11 of the light guide plate 10 from the interior of the through-hole 13.

The wiring substrate 50 includes an insulating base 51, a first wiring layer 52a provided on the insulating base 51, an insulating first cover layer 53 provided on the first wiring layer 52a, a second wiring layer 52b provided on the first cover layer 53, and a second cover layer 54 covering a portion of the second wiring layer 52b. The second cover layer 54 is provided between the second wiring layer 52b and the portion 41a of the light-reflective member 41 located under the stacked structure body 111.

The insulating base 51, the first cover layer 53, and the second cover layer 54 may include, for example, a resin such as polyimide, polyethylene naphthalate, polyethylene terephthalate, etc. The first wiring layer 52a and the second wiring layer 52b may include, for example, a metal material such as copper, aluminum, etc.

The electrode 23 of the light source 20 is bonded to the second wiring layer 52b via a conductive bonding member 61. The bonding member 61 may include, for example, solder such as Au—Sn, Au—Ag—Cu, Au—Bi, etc. Also, the first light-transmitting member 70 is provided around the bonding member 61 between the wiring substrate 50 and the lower surface of the light source 20.

A first light-modulating member 80 is provided on the first light-transmitting member 70. The first light-modulating member 80 is reflective and transmissive to the light emitted by the light source 20. The first light-modulating member 80 may be a resin member that includes a light-diffusing agent. The first light-modulating member 80 may cover the entirety or a portion of the upper surface of the first light-transmitting member 70. It is favorable for the first light-modulating member 80 to overlap the light source 20 when viewed in plan. In the example shown in FIG. 2, the first light-modulating member 80 overlaps the light source 20 when viewed in plan. As shown in FIG. 1, the first light-modulating member 80 is rectangular and is larger than the rectangular light source 20 when viewed in plan. The first light-modulating member 80 may have a shape such as circular, triangular, hexagonal, octagonal, etc., when viewed in plan. The first light-modulating member 80 may extend onto the upper surface of the first light-transmitting member 70 and the first major surface 11 of the light guide plate at the periphery of the upper surface of the first light-transmitting member 70. For example, a fine particle of $TiO_2$, $SiO_2$, $Al_2O_3$, ZnO, or the like is an example of the light-diffusing agent.

The first light-transmitting member 70 is provided between the second light-modulating member 25 and the first light-modulating member 80 on the light source 20. The transmittance for the light emitted by the light source 20 is higher in the first light-transmitting member 70 than in the second light-modulating member 25 and the first light-modulating member 80. The transmittance of the first light-transmitting member 70 for the light emitted by the light source 20 may be 2 times to 100 times the transmittance of the second light-modulating member 25 and the first light-modulating member 80.

The light-reflective member 43 that is inside the partitioning trench 14 suppresses the light guidance between the adjacent light-emitting regions 1. For example, the light that is guided from a light-emitting region 1 in the light-emitting state to a light-emitting region 1 in the non-light-emitting state is limited. Local dimming that has the individual light-emitting regions 1 as the driving unit is possible thereby.

The second light-modulating member 25 and the first light-modulating member 80 that are on the light source 20 diffusely reflect a portion of the light emitted directly upward from the light source 20 and transmit another portion of the light. Thereby, in the light-emitting surface of the planar light source 100, the luminance of the region directly above the light source 20 can be suppressed from being exceptionally greater than the luminance of the other regions.

In the embodiment, the first light-modulating member 80 may be disposed on the first light-transmitting member 70 to be separated from the second light-modulating member 25. In other words, the first light-transmitting member 70 that has a higher transmittance than the second light-modulating member 25 and the first light-modulating member 80 is interposed between the second light-modulating member 25 and the first light-modulating member 80. The light that is emitted from the light source 20, the light that is reflected by the light-reflective member 41 at the periphery of the light source 20, etc., are guided to the first light-transmitting member 70 between the second light-modulating member 25 and the first light-modulating member 80. A portion of the light that is guided to the first light-transmitting member 70 is diffusely reflected by the first light-modulating member 80, and another portion of the light passes through the first light-modulating member 80. The region directly above the light source 20 can be not too bright and not too dark; as a result, the uneven luminance in the light-emitting surface of the light-emitting region 1 can be reduced thereby.

The cover member 24 that is provided at the lower surface of the light source 20 and the light-reflective member 41 that is provided on the wiring substrate 50 at the periphery of the light source 20 suppress the exposure of the wiring substrate 50 at the vicinity of the light source 20 to the light emitted from the light source 20, and the degradation of the wiring substrate 50 can be prevented. The cover member 24 and the light-reflective member 41 can reflect the light toward the first major surface 11 side, which is the light-emitting surface of the planar light source 100, and the luminance of the light extracted from the first major surface 11 can be increased. The light from the light source 20 is guided through the light guide plate 10 toward the partitioning trench 14 while being repeatedly reflected by the light-reflecting sheet 42 and the light-reflective member 41 and undergoing total internal reflection at the first major surface 11. A portion of the light that is guided through the light guide plate 10 is extracted outside the light guide plate 10 from the first major surface 11.

A method for manufacturing the planar light source 100 will now be described with reference to FIGS. 5 to 9.

The method for manufacturing the planar light source 100 of the embodiment includes a process of preparing the stacked structure body 111.

Figure 5:
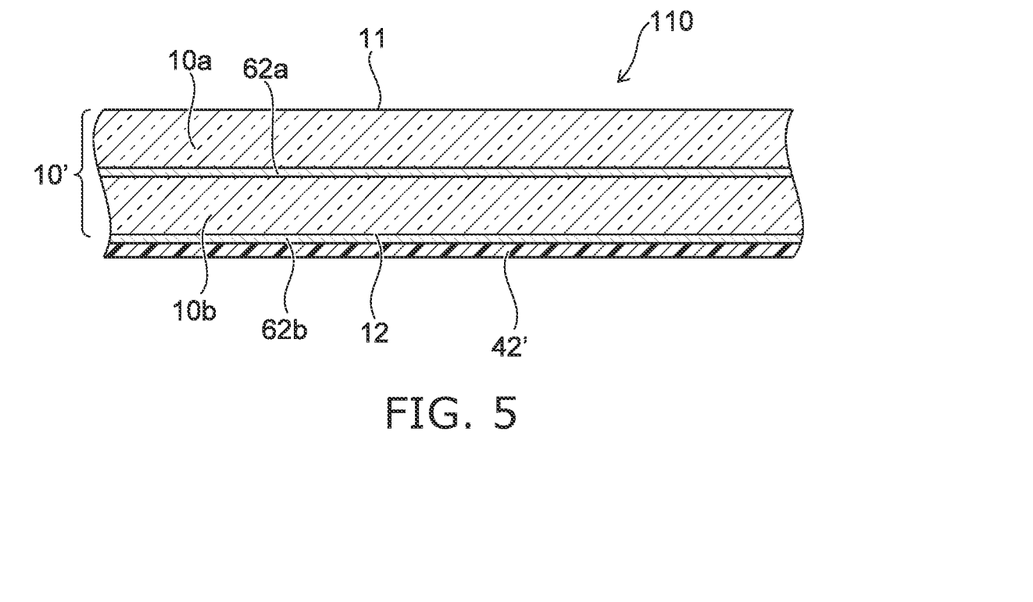
FIGS. 5 and 6 are schematic cross-sectional views showing a method for manufacturing a stacked structure body of the embodiment of the present disclosure.

FIGS. 5 and 6 are schematic cross-sectional views showing the process of preparing the stacked structure body 111.

As shown in FIG. 5, the process of preparing the stacked structure body 111 includes a process of preparing a first stacked structure body 110. The first stacked structure body 110 includes a first light guide plate 10' that includes the first major surface 11 and the second major surface 12 at the side opposite to the first major surface 11, and a light-reflecting sheet 42' that is bonded to the second major surface 12 of the first light guide plate 10' via the bonding layer 62b.

The through-hole 13 that includes the first hole 15 and the second hole 16 shown in FIG. 6 is formed in the first stacked structure body 110. The stacked structure body 111 is obtained by forming the through-hole 13 in the first stacked structure body 110 to extend through the first stacked structure body 110 in the stacking direction. The second hole 16 that is formed in the light-reflecting sheet 42 is at a position overlapping the first hole 15 of the light guide plate 10.

The stacked structure body 111 that includes the through-hole 13 may be prepared by procuring. The stacked structure body 111 may be prepared by procuring the first stacked structure body 110 that does not include the through-hole 13 and by forming the through-hole 13. Or, the stacked structure body 111 may be prepared by procuring the first light guide plate 10' that does not include the first hole 15 or the light-reflecting sheet 42' that does not include the second hole 16, stacking these members, forming the first stacked structure body 110, and forming the through-hole 13.

The method for manufacturing the planar light source 100 of the embodiment further includes a process of preparing the wiring substrate 50 and a process of disposing the light-reflective member 41 on the wiring substrate 50.

Figure 7:
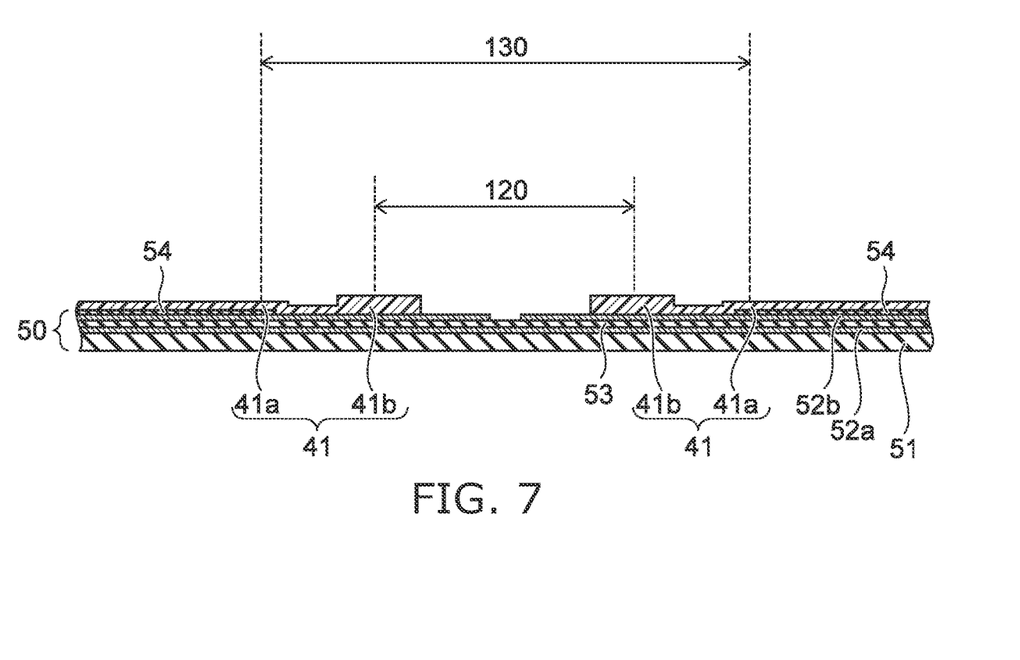
FIG. 7 to FIG. 9 are schematic cross-sectional views showing a method for manufacturing the planar light source of the embodiment of the present disclosure.

As shown in FIG. 7, the wiring substrate 50 includes a first region 130 that includes a light source placement section 120. The light source placement section 120 is a portion that overlaps the light source 20, and the first region 130 is a portion that overlaps the through-hole 13 of the stacked structure body 111.

The light-reflective member 41 is located at least in the first region 130. In the embodiment, the light-reflective member 41 is provided over a wider surface area than the first region 130. The light-reflective member 41 is not provided at the central portion of the light source placement section 120.

For example, the light-reflective member 41 may be formed by at least one selected from the group consisting of bonding a resin sheet, printing, and inkjet. For example, the thick film portion 41b is located at the outer edge portion vicinity of the light source placement section 120 by partially forming two layers of the light-reflective member 41.

Figure 8:
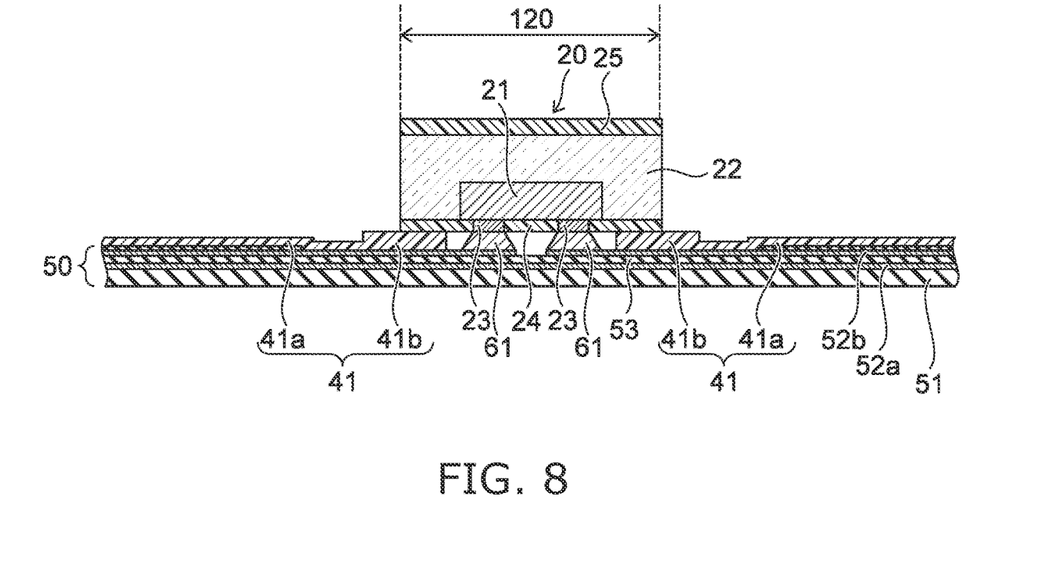

As shown in FIG. 8, the light source 20 is located at the light source placement section 120. The bonding member 61 is supplied onto the second wiring layer 52b at the central portion of the light source placement section 120 where the light-reflective member 41 is not provided. For example, solder is supplied by printing, jet dispenser, etc., as the bonding member 61. An outer portion of the lower surface of the light source 20 is located on the thick film portion 41b of the light-reflective member 41.

The light source 20 is located at the light source placement section 120 so that the electrodes 23 of the light-emitting element 21 contact the bonding members 61. Then, the second wiring layer 52b and the electrodes 23 of the light-emitting element 21 are connected via the bonding members 61 by reflow of the solder, which is the bonding members 61.

At this time, the light guide plate 10 is not yet disposed on the wiring substrate 50. Therefore, the material of the light guide plate 10 can have low heat resistance to the solder reflow temperature, and the degrees of freedom when selecting the material of the light guide plate 10 are high. It is also possible to dispose the light source 20 on the wiring substrate 50 after disposing the light guide plate 10 on the wiring substrate 50 if the material of the light guide plate 10 has high heat resistance to the solder reflow temperature.

Figure 9:
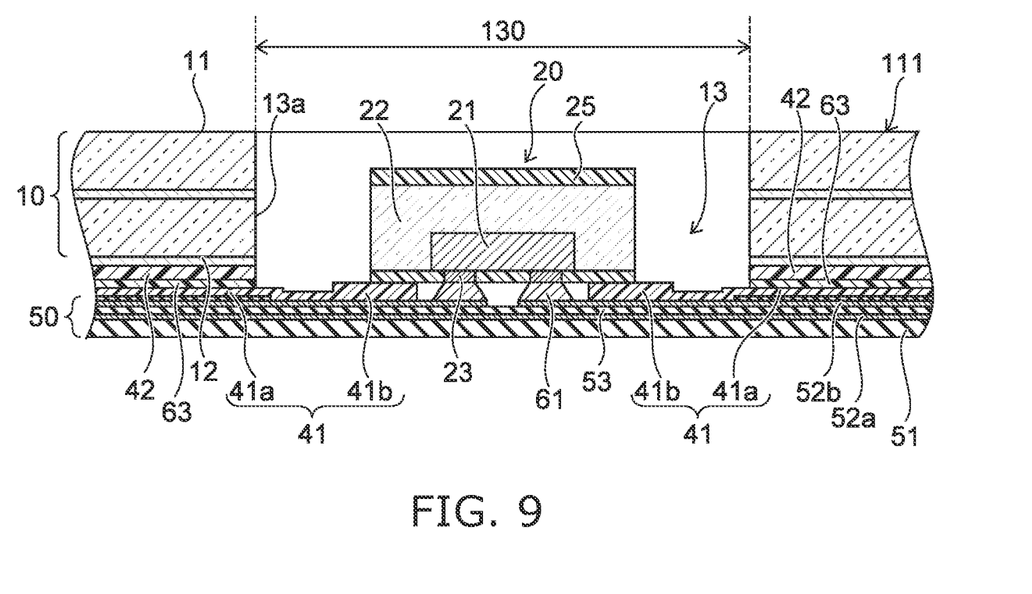

After disposing the light source 20 at the light source placement section 120 of the wiring substrate 50, the stacked structure body 111 is disposed on the wiring substrate 50 by causing the second major surface 12 of the light guide plate 10 to face the wiring substrate 50 so that the through-hole 13 of the stacked structure body 111 overlaps the first region 130, and so that the light source 20 is positioned inside the through-hole 13 as shown in FIG. 9. The bonding layer 63 is interposed between the light-reflecting sheet 42 of the stacked structure body 111 and the light-reflective member 41 on the wiring substrate 50. A gap exists between the inner side surface 13a of the through-hole 13 and the side surface of the light source 20 located inside the through-hole 13.

After disposing the stacked structure body 111 on the wiring substrate 50, the first light-transmitting member 70 is formed inside the through-hole 13 as shown in FIG. 3. The first light-transmitting member 70 is formed on the light-reflective member 41 inside the through-hole 13 and covers the light-reflective member 41. The first light-transmitting member 70 also covers the inner side surface 13a of the through-hole 13 and the side surface and the upper surface of the light source 20.

After forming the first light-transmitting member 70, the partitioning trench 14 shown in FIG. 2 is formed in the light guide plate 10. For example, the partitioning trench 14 is formed using a laser, a mold, a rotary blade such as a dicing saw, or the like, a cutter such as a Thomson blade, etc. The light-reflective member 43 is formed inside the partitioning trench 14. The first light-modulating member 80 is formed on the first light-transmitting member 70. For example, the light-reflective member 43 and the first light-modulating member 80 can be simultaneously formed from the same material.

According to the embodiment, the light-reflective member 41 is preformed on the wiring substrate 50 inside the through-hole 13, and the light source 20 is disposed so that a portion of the light source 20 overlaps a portion of the light-reflective member 41. Therefore, the light-reflective member 41 does not adhere to the side surface of the light source 20 and the inner side surface 13a of the through-hole 13. The light that is emitted from the side surface of the light source 20 can be guided into the light guide plate 10 via the inner side surface 13a of the through-hole 13. The luminance of the light emitted from the first major surface 11, which is the light-emitting surface, can be increased thereby.

The thick film portion 41b that is thicker than the portion 41a between the light guide plate 10 and the wiring substrate 50 is formed in a portion of the light-reflective member 41 where the light source 20 is located. Due to the thick film portion 41b, the position of the lower end of the side surface of the second light-transmitting member 22 of the light source 20 can be higher, and the surface area of the side surface of the second light-transmitting member 22 that faces the end surface of the light-reflecting sheet 42 at the through-hole 13 side can be small. Thereby, the reflections by the end surface of the light-reflecting sheet 42 of the light of the light source 20 emitted from the side surface of the second light-transmitting member 22 can be suppressed and the amount of light guided into the light guide plate 10 can be increased while reducing the thickness of the entire planar light source 100. Also, the thick film portion 41b may contact the cover member 24 of the light source 20. The light from the light source 20 can be prevented from propagating to the bonding member 61, and the absorption of the light by the bonding member 61 can be reduced thereby.

Figure 4B:
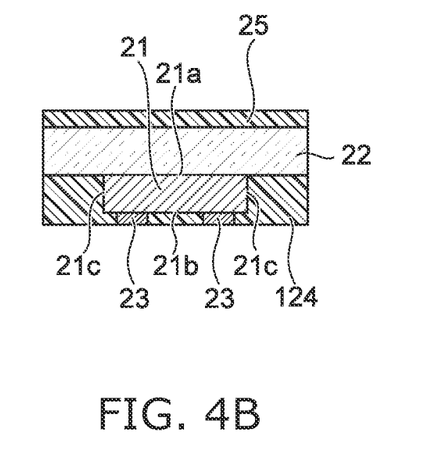
FIG. 4B is a schematic cross-sectional view of a light source of another embodiment of the present disclosure.

FIG. 4B is a schematic cross-sectional view of another example of a light source.

A cover member 124 covers the element side surface 21c and the element lower surface 21b of the light-emitting element 21. The cover member 124 is reflective to the light emitted by the light source 20. The cover member 124 is, for example, a white resin member including a fine particle of $TiO_2$, $SiO_2$, $Al_2O_3$, ZnO, or the like as a light-diffusing agent.

The second light-transmitting member 22 is provided on the element upper surface 21a of the light-emitting element 21. The second light-transmitting member 22 is provided also on the cover member 124 that covers the element side surface 21c of the light-emitting element 21.

The embodiments of the present disclosure have been described with reference to specific examples. However, the present disclosure is not limited to these specific examples. Based on the above-described embodiments of the present disclosure, all embodiments that can be implemented with appropriately design modification by one skilled in the art are also within the scope of the present disclosure as long as the gist of the present disclosure is included. Besides, within the scope of the spirit of the present disclosure, one skilled in the art can conceive various modifications, and the modifications fall within the scope of the present disclosure.

What is claimed is:

1. A method for manufacturing a planar light source, the method comprising:
    preparing a wiring substrate including a first region that includes a light source placement section;
    disposing a light-reflective member in the first region of the wiring substrate;
    preparing a transmissive light guide plate including
        a first major surface,
        a second major surface opposite to the first major surface, and
        a first hole extending from the first major surface to the second major surface;
    disposing a light source on the light-reflective member at the light source placement section, and bonding the light source on the wiring substrate;
    after bonding the light source on the wiring substrate, disposing the light guide plate on the wiring substrate to cause the wiring substrate and the second major surface of the light guide plate to face each other to cause the light source to be positioned in the first hole; and
    after disposing the light guide plate on the wiring substrate, disposing a first light-transmitting member in the first hole.

2. The method according to claim 1, wherein
    the preparing the light guide plate includes preparing a stacked structure body,
    the stacked structure body includes the light guide plate and a light-reflecting sheet,
    the light-reflecting sheet is bonded to the second major surface of the light guide plate and includes a second hole at a position overlapping the first hole, and
    the stacked structure body includes a through-hole including the first and second holes.

3. The method according to claim 2, wherein
    the preparing the stacked structure body includes preparing a first stacked structure body,
    the first stacked structure body includes:
        a first light guide plate that includes the first and second major surfaces but does not include the first hole; and
        a first light-reflecting sheet that is bonded to the second major surface of the first light guide plate but does not include the second hole,
    the first stacked structure body does not include the through-hole, and
    the preparing the stacked structure body includes forming the through-hole through the first stacked structure body in a stacking direction to include the first hole of the light guide plate and the second hole of the light-reflecting sheet.

4. The method according to claim 1, wherein
    the light-reflective member has a greater surface area than a surface area of the first hole of the light guide plate.

5. The method according to claim 1, wherein
    the light-reflective member includes a thick film portion, and
    the thick film portion is located at the light source placement section and is thicker than a portion between the wiring substrate and the second major surface of the light guide plate.

6. The method according to claim 1, wherein the method further comprising forming the light-reflective member using at least one selected from the group consisting of bonding a resin sheet, printing, and inkjet.

7. The method according to claim 1, further comprising:
    forming a first light-modulating member on the first light-transmitting member,
    the first light-modulating member including a light-diffusing agent.

8. The method according to claim 1, wherein
    the light source includes:
        a light-emitting element including
            a semiconductor stacked body including a first surface, a second surface opposite to the first surface, and a side surface between the first surface and the second surface, and
            an electrode located at the second surface;
        a second light-transmitting member covering the side surface of the semiconductor stacked body; and a cover member covering the second surface of the semiconductor stacked body and leaving the electrode exposed.

9. The method according to claim 8, wherein the light source includes a second light-modulating member above the first surface of the semiconductor stacked body, and the second light-modulating member includes a light-diffusing agent.

* * * * *